(12) United States Patent
Oginoe et al.

(10) Patent No.: US 9,530,788 B2
(45) Date of Patent: Dec. 27, 2016

(54) METALLIC ETCH STOP LAYER IN A THREE-DIMENSIONAL MEMORY STRUCTURE

(71) Applicant: SANDISK TECHNOLOGIES INC., Plano, TX (US)

(72) Inventors: Tomohiro Oginoe, Yokkkaichi (JP); Ryoichi Honma, Yokkaichi (JP); Masanori Terahara, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/659,963

(22) Filed: Mar. 17, 2015

(65) Prior Publication Data

US 2016/0276359 A1 Sep. 22, 2016

(51) Int. Cl.
*H01L 27/115* (2006.01)
*H01L 29/792* (2006.01)
(Continued)

(52) U.S. Cl.
CPC ... *H01L 27/11582* (2013.01); *H01L 21/28273* (2013.01); *H01L 21/28282* (2013.01);
(Continued)

(58) Field of Classification Search
CPC ............ H01L 27/11582; H01L 29/7926; H01L 23/5226; H01L 29/51; H01L 29/4958; H01L 29/7889; H01L 27/1157; H01L 29/16; H01L 29/42328; H01L 21/28273; H01L 21/28282; H01L 29/66833; H01L 29/66825; H01L 29/42344; H01L 29/42376
See application file for complete search history.

(56) References Cited

U.S. PATENT DOCUMENTS 5,084,417 A    1/1992 Joshi et al.
5,807,788 A    9/1998 Brodsky et al.
(Continued)

FOREIGN PATENT DOCUMENTS

KR    10-2009-0001377 A    1/2009
WO    WO02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Jarrett Stark
(74) *Attorney, Agent, or Firm* — The Marbury Law Group PLLC

(57) ABSTRACT

A dielectric liner, a bottom conductive layer, and a stack of alternating layers including insulator layers and spacer material layers are sequentially formed over a substrate. A memory opening extending through the stack can be formed by an anisotropic etch process that employs the bottom conductive layer as an etch stop layer. The memory opening is extended downward by etching through the bottom conductive layer and the dielectric liner, while minimizing an overetch into the substrate. A memory stack structure can be formed in the memory opening. Subsequently, a backside contact trench can be formed through the stack employing the bottom conductive layer as an etch stop layer. The spacer material layers can be removed to form backside recesses, which are filled with a conductive material to form electrically conductive layers. The remaining portion of the bottom conductive layer can be employed as a source select gate electrode.

32 Claims, 14 Drawing Sheets

(51) Int. Cl.

| | | |
|---|---|---|
| *H01L 23/522* | (2006.01) | |
| *H01L 29/51* | (2006.01) | |
| *H01L 29/49* | (2006.01) | |
| *H01L 29/788* | (2006.01) | |
| *H01L 29/16* | (2006.01) | |
| *H01L 29/423* | (2006.01) | |
| *H01L 21/768* | (2006.01) | |
| *H01L 21/28* | (2006.01) | |
| *H01L 29/66* | (2006.01) | |
| *H01L 23/528* | (2006.01) | |

(52) U.S. Cl.
CPC ...... *H01L 21/76897* (2013.01); *H01L 23/528* (2013.01); *H01L 23/5226* (2013.01); *H01L 27/1157* (2013.01); *H01L 27/11524* (2013.01); *H01L 27/11556* (2013.01); *H01L 29/16* (2013.01); *H01L 29/42328* (2013.01); *H01L 29/42344* (2013.01); *H01L 29/42376* (2013.01); *H01L 29/4958* (2013.01); *H01L 29/51* (2013.01); *H01L 29/66825* (2013.01); *H01L 29/66833* (2013.01); *H01L 29/7889* (2013.01); *H01L 29/7926* (2013.01)

(56) References Cited

U.S. PATENT DOCUMENTS

| | | | |
|---|---|---|---|
| 5,915,167 A | 6/1999 | Leedy | |
| 5,985,753 A | 11/1999 | Yu et al. | |
| 6,953,697 B1 | 10/2005 | Castle et al. | |
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,378,353 B2 | 5/2008 | Lee et al. | |
| 7,514,321 B2 | 4/2009 | Mokhlesi et al. | |
| 7,575,973 B2 | 8/2009 | Mokhlesi et al. | |
| 7,608,195 B2 | 10/2009 | Wilson | |
| 7,648,872 B2 | 1/2010 | Benson | |
| 7,696,559 B2 | 4/2010 | Arai et al. | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,093,725 B2 | 1/2012 | Wilson | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,283,228 B2 | 10/2012 | Alsmeier | |
| 8,349,681 B2 | 1/2013 | Alsmeier et al. | |
| 8,415,742 B2 | 4/2013 | Kim et al. | |
| 8,445,347 B2 | 5/2013 | Alsmeier | |
| 8,614,126 B1 | 12/2013 | Lee et al. | |
| 8,828,884 B2 | 9/2014 | Lee et al. | |
| 8,956,968 B2 * | 2/2015 | Higashitani | H01L 27/11565 257/E21.577 |
| 2002/0168849 A1 | 11/2002 | Lee et al. | |
| 2006/0068592 A1 | 3/2006 | Dostalik | |
| 2006/0102586 A1 | 5/2006 | Lee et al. | |
| 2007/0210338 A1 | 9/2007 | Orlowski | |
| 2007/0252201 A1 | 11/2007 | Kito et al. | |
| 2008/0258308 A1 | 10/2008 | Liu et al. | |
| 2009/0230449 A1 | 9/2009 | Sakaguchi et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0031547 A1 | 2/2011 | Watanabe | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2011/0291177 A1 | 12/2011 | Lee et al. | |
| 2011/0291178 A1 | 12/2011 | Sasaki et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0001252 A1 | 1/2012 | Alsmeier et al. | |
| 2012/0012920 A1 | 1/2012 | Shin et al. | |
| 2012/0034785 A1 | 2/2012 | Hayashi et al. | |
| 2012/0146127 A1 | 6/2012 | Lee et al. | |
| 2012/0146422 A1 | 6/2012 | Mechi et al. | |
| 2012/0199897 A1 | 8/2012 | Chang et al. | |
| 2012/0256247 A1 | 10/2012 | Alsmeier | |
| 2013/0069139 A1 | 3/2013 | Ishihara et al. | |
| 2013/0069140 A1 | 3/2013 | Ichinose et al. | |
| 2013/0122712 A1 | 5/2013 | Kim et al. | |
| 2013/0130495 A1 * | 5/2013 | Higashitani | H01L 27/11565 438/630 |
| 2013/0134492 A1 | 5/2013 | Yang et al. | |
| 2013/0168752 A1 * | 7/2013 | Kim | H01L 27/11582 257/314 |
| 2013/0224960 A1 | 8/2013 | Payyapilly et al. | |
| 2013/0248974 A1 | 9/2013 | Alsmeier et al. | |
| 2013/0264631 A1 | 10/2013 | Alsmeier et al. | |
| 2013/0313627 A1 | 11/2013 | Lee et al. | |
| 2014/0008714 A1 | 1/2014 | Makala et al. | |
| 2014/0264533 A1 | 9/2014 | Simsek-Ege et al. | |
| 2014/0264542 A1 | 9/2014 | Simsek-Ege et al. | |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM—2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Au, Y. et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

(56) References Cited

OTHER PUBLICATIONS

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

M. Claes et al., "Selective Wet Etching of Hf-based Layers," Abstracts, 204th Meeting of the Electrochemical Society, 2003.

Endoh, et al., "Novel Ultra High Density Memory with a Stacked-Surrounding Gate Transistor (S-SGT) Structured Cell," IEDM Proc. (2001) 33-36.

Geil et al., "Etch Resistance of Focused-Ion-Beam-Implanted $SiO_2$," LEOS 1991: Summer Topical Meetings on Epitaxial Materials and In-situ Processing for Optoelectronic Devices, Jul. 29-31, 1991 and Microfabrication for Photonics and Optoelectronics, Jul. 31-Aug. 2, 1991.

Qian et al., "Fabrication of Si Microstructures Using Focused Ion Beam Implantation and Reactive Ion Etching," 2008 J. Micromech. Microeng. 18, 035003, 5pgs.

Sievila et al., "The Fabrication of Silicon Nanostructures by Focused-Ion-Beam Implantation and TMAH Wet Etching," 2010 Nanotechnology, 21, 145301, 6pgs.

Chekurov et al., "The Fabrication of Silicon Nanostructures by Local Gallium Implantation and Cryogenic Deep Reactive Ion Etching," 2009 Nanotechnology, 20, 065307, 5pgs.

Invitation to Pay Additional Fees, International Application No. PCT/US2013/049758, dated Oct. 10, 2013, 6pgs.

International Search Report and Written Opinion received in connection with international application No. PCT/US2014/044833; mailed Oct. 2, 2014.

Invitation to Pay Additional Fees, including Annex to Form PCT/ISA/206 Communication Relating to the Results of the Partial International Search for PCT/US2014/048160, issued on Oct. 31, 2014.

Rem, J. B. et al., "Incubation Time Measurements in Thin-Film Deposition," J. Electrochem. Soc., vol. 144, No. 6, pp. 2101-2106 (1997).

U.S. Appl. No. 13/762,988, filed Feb. 8, 2013, SanDisk Technologies Inc.
U.S. Appl. No. 14/133,979, filed Dec. 19, 2013, SanDisk Technologies Inc.
U.S. Appl. No. 14/183,152, filed Feb. 18, 2014, SanDisk Technologies Inc.
U.S. Appl. No. 14/219,161, filed Mar. 19, 2014, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.
U.S. Appl. No. 14/319,283, filed Jun. 30, 2014, SanDisk Technologies Inc.
U.S. Appl. No. 14/456,515, filed Aug. 11, 2014, SanDisk Technologies Inc.
U.S. Appl. No. 13/544,328, filed Jul. 9, 2012, SanDisk Technologies Inc.
U.S. Appl. No. 13/754,293, filed Jan. 30, 2013, SanDisk Technologies Inc.
U.S. Appl. No. 13/933,236, filed Jul. 2, 2013, SanDisk Technologies Inc.
U.S. Appl. No. 14/341,079, filed Jul. 25, 2014, SanDisk Technologies Inc.
U.S. Appl. No. 14/560,308, filed Dec. 4, 2014, SanDisk Technologies Inc.
U.S. Appl. No. 14/560,351, filed Dec. 4, 2014, SanDisk Technologies Inc.

* cited by examiner

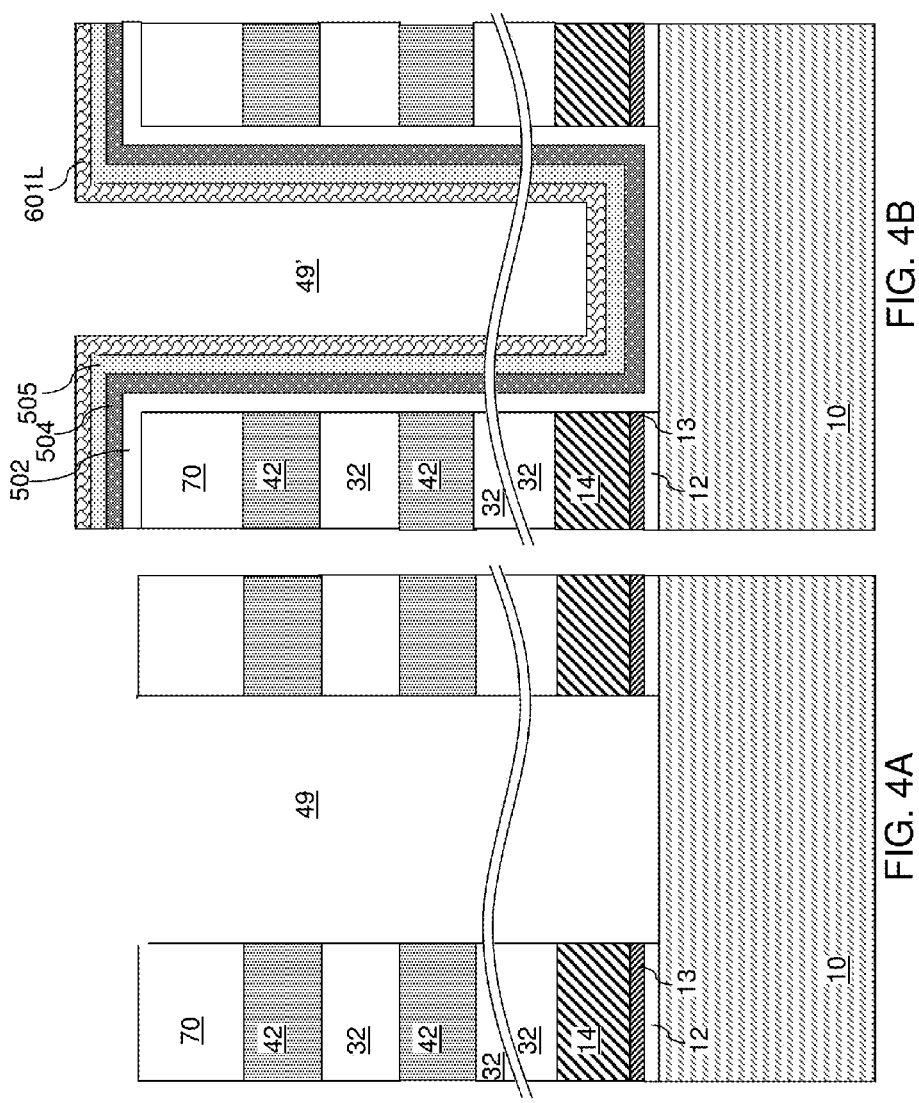

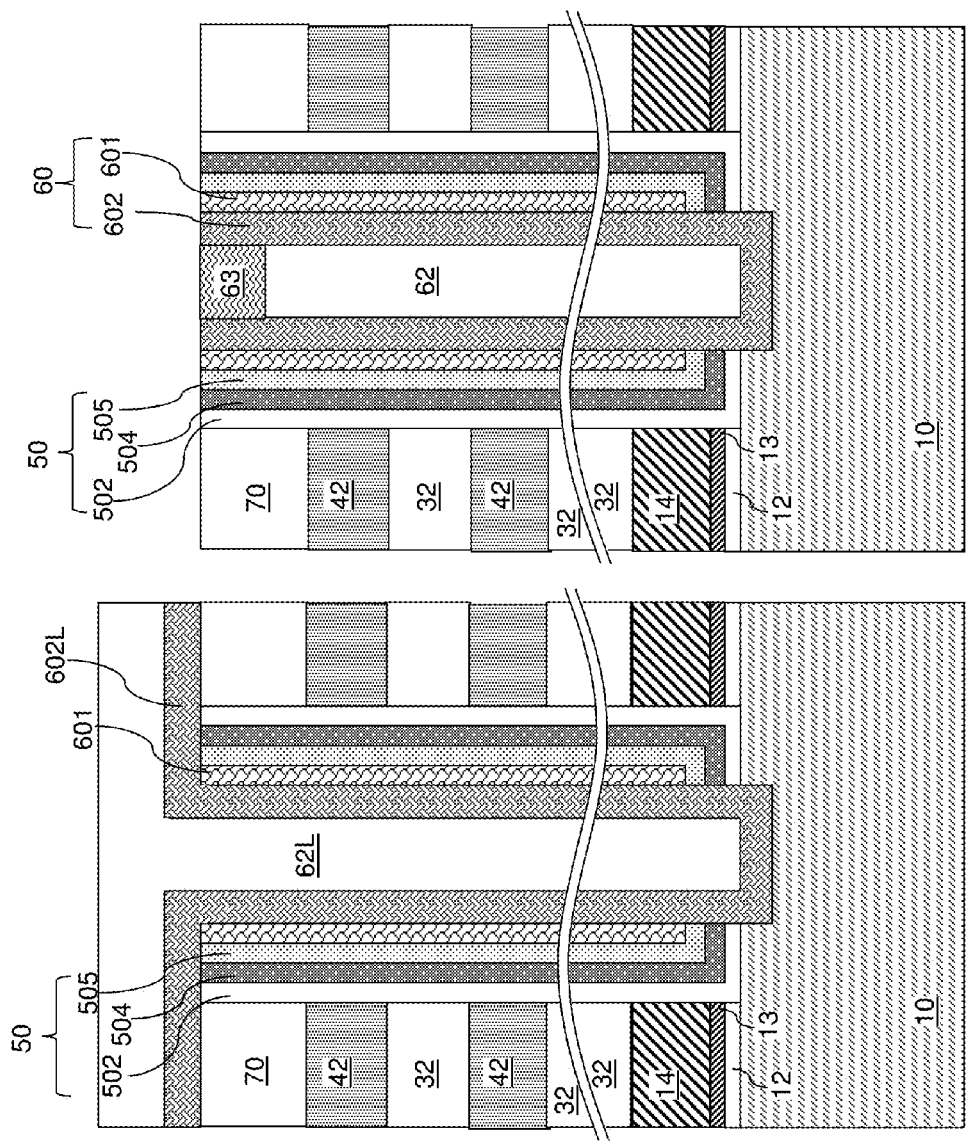

METALLIC ETCH STOP LAYER IN A THREE-DIMENSIONAL MEMORY STRUCTURE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional NAND memory device is provided, which comprises a dielectric liner contacting a top surface of a semiconductor substrate; a bottom conductive layer contacting a top surface of the dielectric liner; a stack of alternating layers comprising insulator layers and electrically conductive layers and located over the bottom conductive layer; a memory opening extending through the stack, the bottom conductive layer, and the dielectric liner; and a memory film located within the memory opening, wherein a bottommost surface of the memory film is coplanar with a bottom surface of the dielectric liner.

According to another aspect of the present disclosure, a method of manufacturing a three-dimensional memory structure is provided. A dielectric liner is formed on a top surface of a semiconductor substrate. A bottom conductive layer is formed on the dielectric liner. A stack of alternating layers comprising insulator layers and spacer material layers is formed over the bottom conductive layer. The spacer material layers have a different composition than the bottom conductive layer. A memory opening extending through the stack is formed by an anisotropic etch process that employs the bottom conductive layer as an etch stop layer. The memory opening is extended downward by etching through a first physically exposed portion of the bottom conductive layer and a first physically exposed portion of the dielectric liner. A memory film and a vertical semiconductor channel are formed within the memory opening.

BRIEF DESCRIPTION OF THE DRAWINGS

FIGS. 4A-4F are sequential vertical cross-sectional views of a memory opening within the exemplary structure during various processing steps employed to form a memory stack structure according to an embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
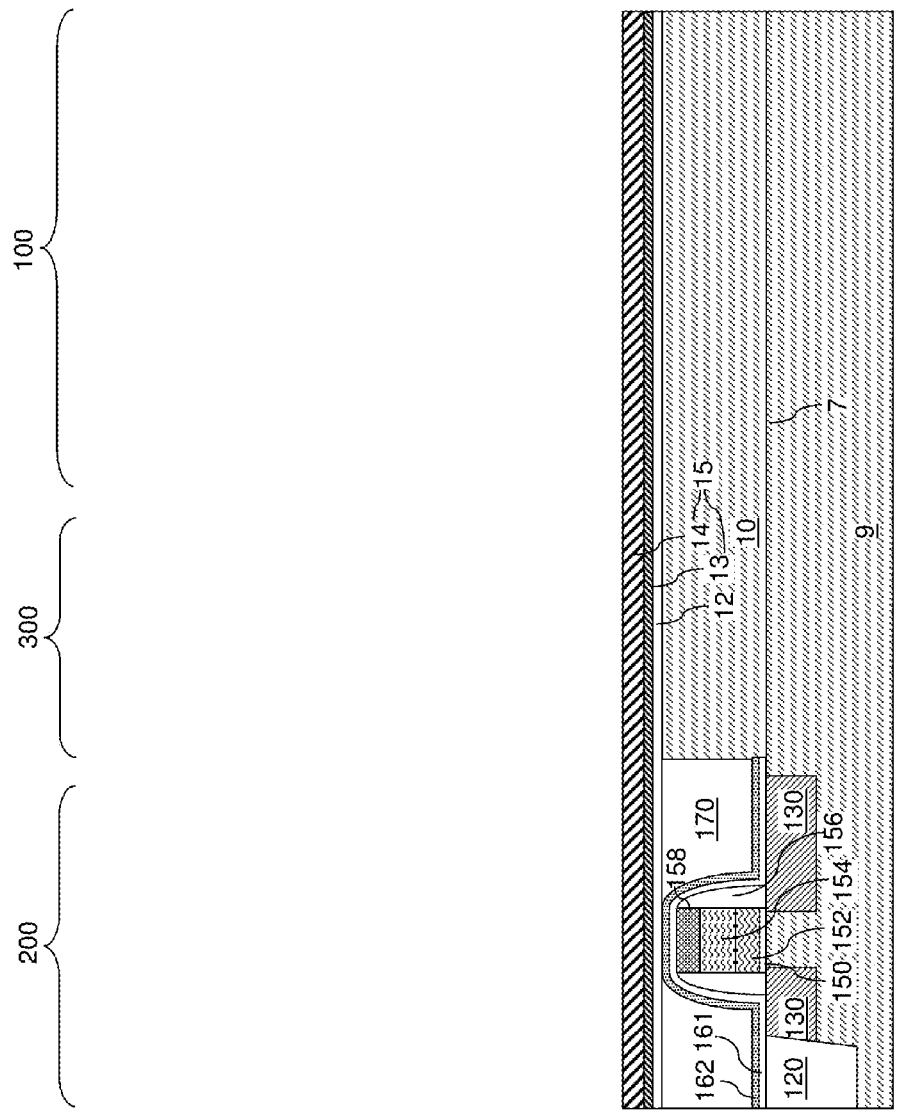
FIG. 1 is a vertical cross-sectional view of an exemplary structure after formation of a bottom conductive layer according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed in a region of the exemplary structure, which is herein referred to as a peripheral device region 200. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. Dielectric metal oxide can have a dielectric constant greater than 7.9, i.e., can have a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. Dielectric metal oxides can be deposited, for example, by chemical vapor deposition (CVD), atomic layer deposition (ALD), pulsed laser deposition (PLD), liquid source misted chemical deposition, or a combination thereof.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

The exemplary structure further includes a device region 100 in which an array of memory stack structures is to be subsequently formed, and a contact region 300 in which stepped surfaces of electrically conductive layers and contact via structures are to be subsequently formed. An optional semiconductor material layer 10 can be formed in the device region 100 and the contact region 300. The optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

A dielectric liner 12 can be formed above the semiconductor material layer 10 and optionally above the planarization dielectric layer 170. The dielectric liner 12 can be, for example, silicon oxide layer or a dielectric metal oxide layer.

The dielectric liner 12 can be formed by conversion of a surface portion of a semiconductor material within a semiconductor substrate (9, 10) (such as a surface portion of the semiconductor material layer 10), and/or by deposition of a dielectric material, for example, by chemical vapor deposition (CVD) and/or atomic layer deposition. The thickness of the dielectric liner 12 can be in a range from 3 nm to 30 nm, although lesser and greater thicknesses can also be employed. The dielectric liner 12 can be employed as a gate dielectric for source side select transistors that are subsequently formed and are employed to select a set of semiconductor channels to be activated during operation of a NAND array. Specifically, the source side select transistors control current flow through a horizontal semiconductor channel that underlies the dielectric liner 12, which functions as a gate dielectric for the source side select transistors.

Subsequently, a bottom conductive layer 15 is formed on the dielectric liner 12. The bottom conductive layer 15 can comprise at least one metallic material. In one embodiment, the bottom conductive layer 15 can consist essentially of at least one metallic material. In one embodiment, the bottom conductive layer 15 can include a stack, from bottom to top, of a bottom metallic liner 13 comprising a first conductive metallic compound and a bottom metallic material layer 14 comprising a first metallic material.

The bottom metallic liner 13 can be formed directly on the top surface of the dielectric liner 12. The first conductive metallic compound of the bottom metallic liner 13 can be a conductive metallic nitride such as TiN, TaN, WN, or a combination thereof, or a conductive metallic carbide such as TiC, TaC, WC, or a combination thereof. The bottom metallic liner 13 can be formed, for example, by physical vapor deposition. The thickness of the bottom metallic liner 13 can be in a range from 1 nm to 10 nm, although lesser and greater thicknesses can also be employed. In one embodiment, the bottom metallic liner 13 can be a TiN layer.

The bottom metallic material layer 14 can be formed on the top surface of the bottom metallic liner 13. The first metallic material of the bottom metallic material layer 14 can be at least one elemental metal (i.e., an elemental metal or a combination of at least two elemental metals either as an alloy or as a stack) including W, Al, Cu, Co, Ni, Mo, Ti, Ta, and/or Ru. As used herein, an elemental metal refers to a metal element within an environment consisting essentially of the atoms of the same elemental metal, i.e., without being alloyed with another elemental metal and without forming a compound with a non-metallic element. The bottom metallic material layer 14 can be formed by physical vapor deposition, chemical vapor deposition, electroplating, electroless plating, or a combination thereof. The thickness of the bottom metallic material layer 14 can be in a range from 2 nm to 60 nm, although lesser and greater thicknesses can also be employed. In one embodiment, the bottom metallic material layer 14 can be a tungsten layer.

Figure 2:
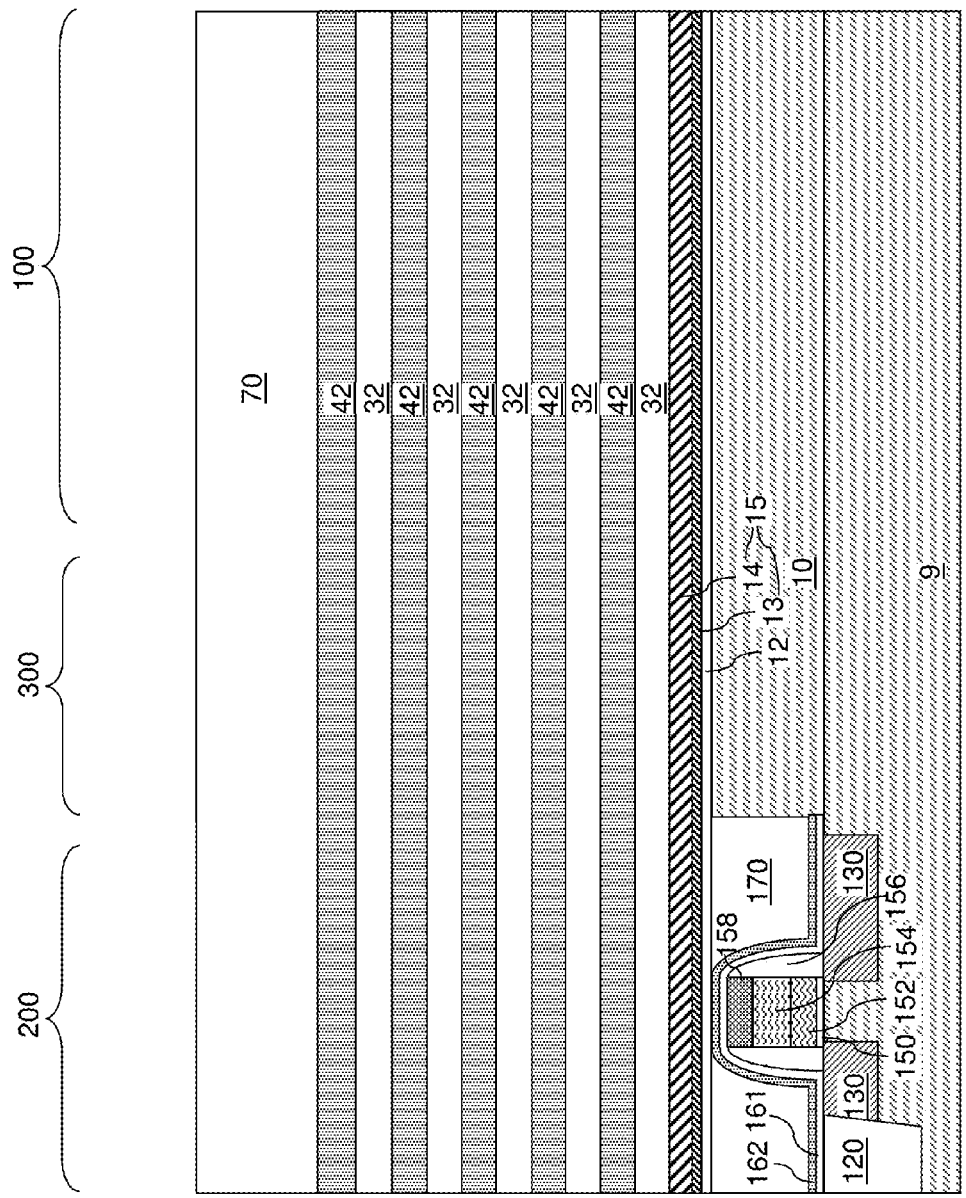
FIG. 2 is a vertical cross-sectional view of the exemplary structure after formation of an alternating stack of first material layers and second material layers and an insulating cap layer according to an embodiment of the present disclosure.

Referring to FIG. 2, a stack of an alternating plurality of first material layers (which can be insulator layers 32) and second material layers (which can be spacer material layers 42) is formed over the top surface of the substrate, which can be, for example, on the top surface of the bottom conductive layer 15. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer (i.e., each spacer material layer 42) can be a sacrificial material layer. In this case, the stack can include an alternating plurality of insulator layers 32 and spacer material layers 42 that include a sacrificial material.

The stack of the alternating plurality is herein referred to as an alternating stack (32, 42). In one embodiment, the alternating stack (32, 42) can include insulator layers 32 composed of the first material, and spacer material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the spacer material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The spacer material layers 42 may comprise an electrically insulating material, a semiconductor material, or a conductive material. The second material of the spacer material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the spacer material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the spacer material layers 42 can be formed, for example, CVD or atomic layer deposition (ALD).

The spacer material layers 42 can be suitably patterned so that conductive material portions to be subsequently formed by replacement of the spacer material layers 42 can function as electrically conductive electrodes, such as the control gate electrodes of the monolithic three-dimensional NAND string memory devices to be subsequently formed. The spacer material layers 42 may comprise a portion having a strip shape extending substantially parallel to the major surface 7 of the substrate.

The thicknesses of the insulator layers 32 and the spacer material layers 42 can be in a range from 20 nm to 50 nm, although lesser and greater thicknesses can be employed for each insulator layer 32 and for each spacer material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each spacer material layer 42 in the alternating stack (32, 42) can have a uniform thickness that is substantially invariant within each respective spacer material layer 42.

Optionally, an insulating cap layer 70 can be formed over the alternating stack (32, 42). The insulating cap layer 70 includes a dielectric material that is different from the material of the spacer material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Figure 3:
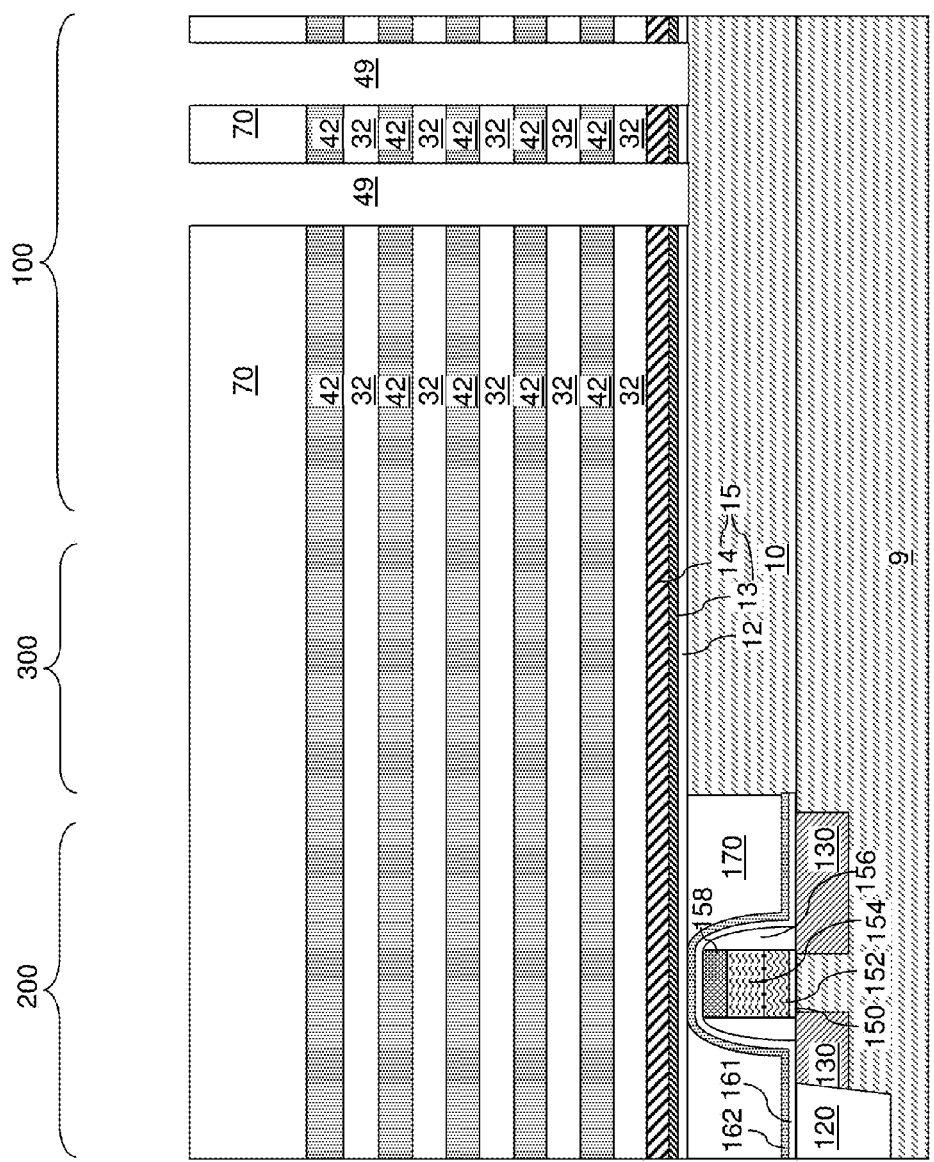
FIG. 3 is a vertical cross-sectional view of the exemplary structure after formation of memory openings according to an embodiment of the present disclosure.

Referring to FIG. 3, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The memory openings 49 can be formed as a two-dimensional array.

In one embodiment, the memory openings 49 can be formed through the alternating stack (32, 42) by an anisotropic etch process that employs the bottom conductive layer 15 as an etch stop layer. In other words, the etch chemistry can be selected such that the bottom conductive layer 15 functions as an etch stop layer. In one embodiment, the etch chemistry can employ a hydrofluorocarbon based etchant gas or a hydrochlorocarbon based etchant gas.

Subsequently, the memory openings 49 can be vertically extended downward by etching each physically exposed portion of the bottom conductive layer 15, and then by etching each physically exposed portion of the dielectric liner 12. The physically exposed portions of the bottom conductive layer 15 underlying the memory openings are herein referred to as first physically exposed portions of the bottom conductive layer 15, and the physically exposed portions of the dielectric liner 12 are herein referred to as first physically exposed portions of the dielectric liner 12. The first physically exposed portion of the dielectric liner 12 can be etched employing an etch chemistry that is selective to a semiconductor material of the semiconductor substrate (9, 10), e.g., the semiconductor material of the semiconductor material layer 10. For example, if the dielectric liner 12 includes silicon oxide, an etch chemistry employing hydrofluoric acid, either in vapor phase or in liquid phase, can be employed to etch the first physically exposed portion of the dielectric liner 12. Overetch into the semiconductor substrate (9, 10) can be eliminated or can be insignificant, and the bottom surfaces of the memory openings 49 can be coplanar with the interface between the semiconductor substrate (9, 10) and the dielectric liner 12.

A memory stack structure can be formed in each of the memory opening employing various embodiments of the present disclosure. FIGS. 4A-4F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 3.

Referring to FIG. 4A, a memory opening 49 after the processing steps of FIG. 3 is illustrated. The memory opening 49 extends through the insulating cap layer 70, the alternating stack (32, 42), the bottom conductive layer 15, and the dielectric liner 12. The bottom surface of the memory opening 49 can be coplanar with the top surface of the semiconductor material layer 10.

Referring to FIG. 4B, a series of layers including at least one blocking dielectric layer 502, a memory material layer 504, a tunneling dielectric layer 505, and an optional first semiconductor channel layer 601L can be sequentially deposited in the memory openings 49. The at least one blocking dielectric layer 502 can include a single blocking dielectric layer or a layered stack of a plurality of blocking dielectric layers.

The at least one blocking dielectric layer 502 can be deposited on the sidewalls of each memory opening 49 by a conformal deposition method. The outer sidewall of the at least one blocking dielectric layer 502 can contact sidewalls of the dielectric liner 12, the bottom metallic liner 13, and the bottom metallic material layer 14. The at least one blocking dielectric layer 502 includes a dielectric material, which can be silicon oxide and/or a dielectric metal oxide. In one embodiment, the at least one blocking dielectric layer 502 can be a silicon oxide layer. The thickness of the at least one blocking dielectric layer 502 can be in a range from 3 nm to 12 nm, although lesser and greater thicknesses can also be employed.

Subsequently, the memory material layer 504, the tunneling dielectric layer 505, and the optional first semiconductor channel layer 601L can be sequentially formed. In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (e.g., floating gates), for example, by being formed within lateral recesses into spacer material layers 42. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

The tunneling dielectric layer 505 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505 can include a stack of a first silicon oxide layer, a silicon oxynitride layer, and a second silicon oxide layer, which is commonly known as an ONO stack. In one embodiment, the tunneling dielectric layer 505 can include a silicon oxide layer that is substantially free of carbon or a silicon oxynitride layer that is substantially free of carbon. The thickness of the tunneling dielectric layer 505 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (502, 504, 505, 601L).

Figure 4C:
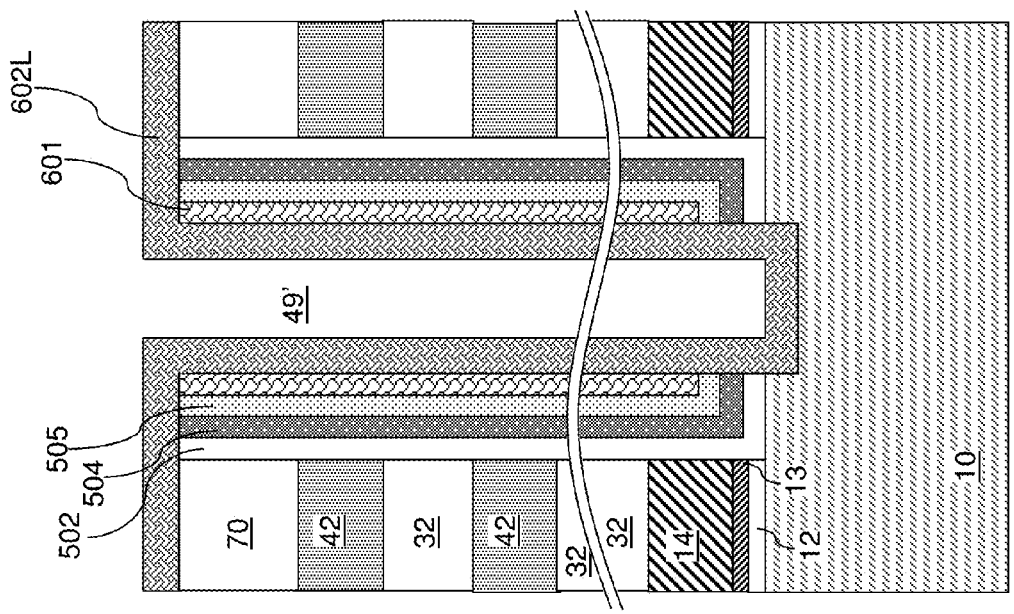

Referring to FIG. 4C, the optional first semiconductor channel layer 601L, the tunneling dielectric layer 505, the memory material layer 504, the at least one blocking dielectric layer 502 are sequentially anisotropically etched employing at least one anisotropic etch process. The portions of the first semiconductor channel layer 601L, the tunneling dielectric layer 505, the memory material layer 504, and the at least one blocking dielectric layer 502 located above the top surface of the insulating cap layer 70 can be removed by the at least one anisotropic etch process. Further, the horizontal portions of the first semiconductor channel layer 601L, the tunneling dielectric layer 505, the memory material layer 504, and the at least one blocking dielectric layer 502 at a bottom of each cavity 49' can be removed to form openings in remaining portions thereof. Each of the first semiconductor channel layer 601L, the tunneling dielectric layer 505, the memory material layer 504, and the at least one blocking dielectric layer 502 can be etched by anisotropic etch process.

Each remaining portion of the first semiconductor channel layer 601L constitutes a first semiconductor channel portion 601. Each remaining portion of the memory material layer 504 includes at least one charge storage element, and can include a plurality of charge storage elements. In one embodiment, the number of the charge storage elements in a memory material layer 504 can be at least the total number of control gate electrodes to be formed around the memory material layer 504. In one embodiment, the memory material layer 504 can be a contiguous layer, i.e., can be a charge storage layer. A surface of the semiconductor material layer 10 (or the substrate semiconductor layer 9 if the semiconductor material layer 10 is not present) can be physically exposed underneath the opening through the first semiconductor channel portion 601, the tunneling dielectric layer 505, the memory material layer 504, and the at least one blocking dielectric layer 502. Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance, rd. A tunneling dielectric layer 505 is embedded within a memory material layer 504. The memory material layer 504 can comprise a charge trapping material or a floating gate material.

In one embodiment, the first semiconductor channel portion 601, the tunneling dielectric layer 505, the memory material layer 504, and the at least one blocking dielectric layer 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 4D:
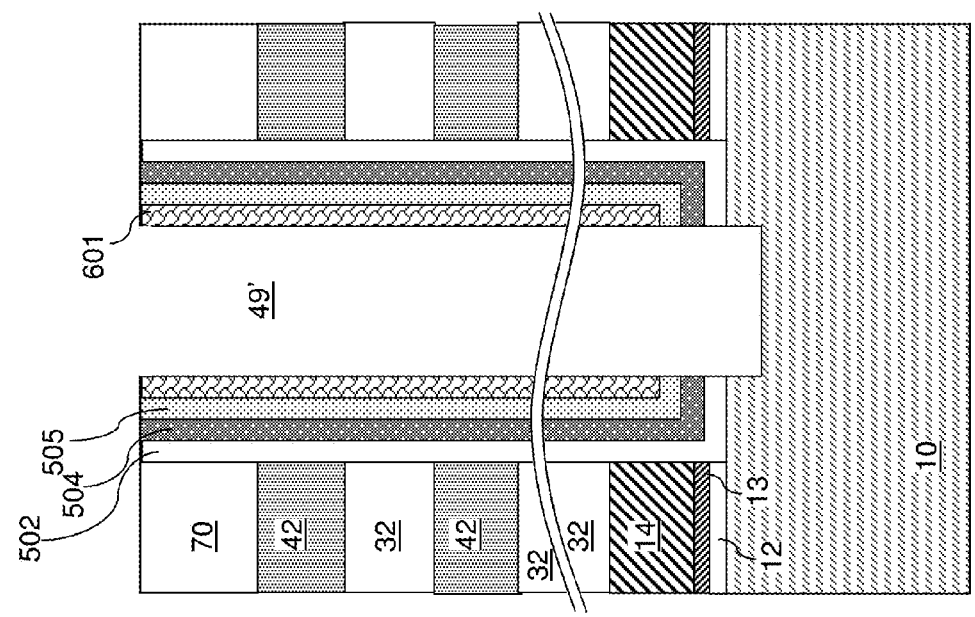

Referring to FIG. 4D, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 4E, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 4F, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a vertical semiconductor channel 60 through which electrical current can flow when a vertical NAND device including the vertical semiconductor channel 60 is turned on. A tunneling dielectric layer 505 is embedded within a memory material layer 504, and laterally surrounds a portion of the vertical semiconductor channel 60. Each adjoining set of at least one blocking dielectric layer 502, a memory material layer 504, and a tunneling dielectric layer 505 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. Within each memory opening, a lateral stack is formed, which includes, from outside to inside, a memory film 50 and a vertical semiconductor channel 60.

Figure 5:
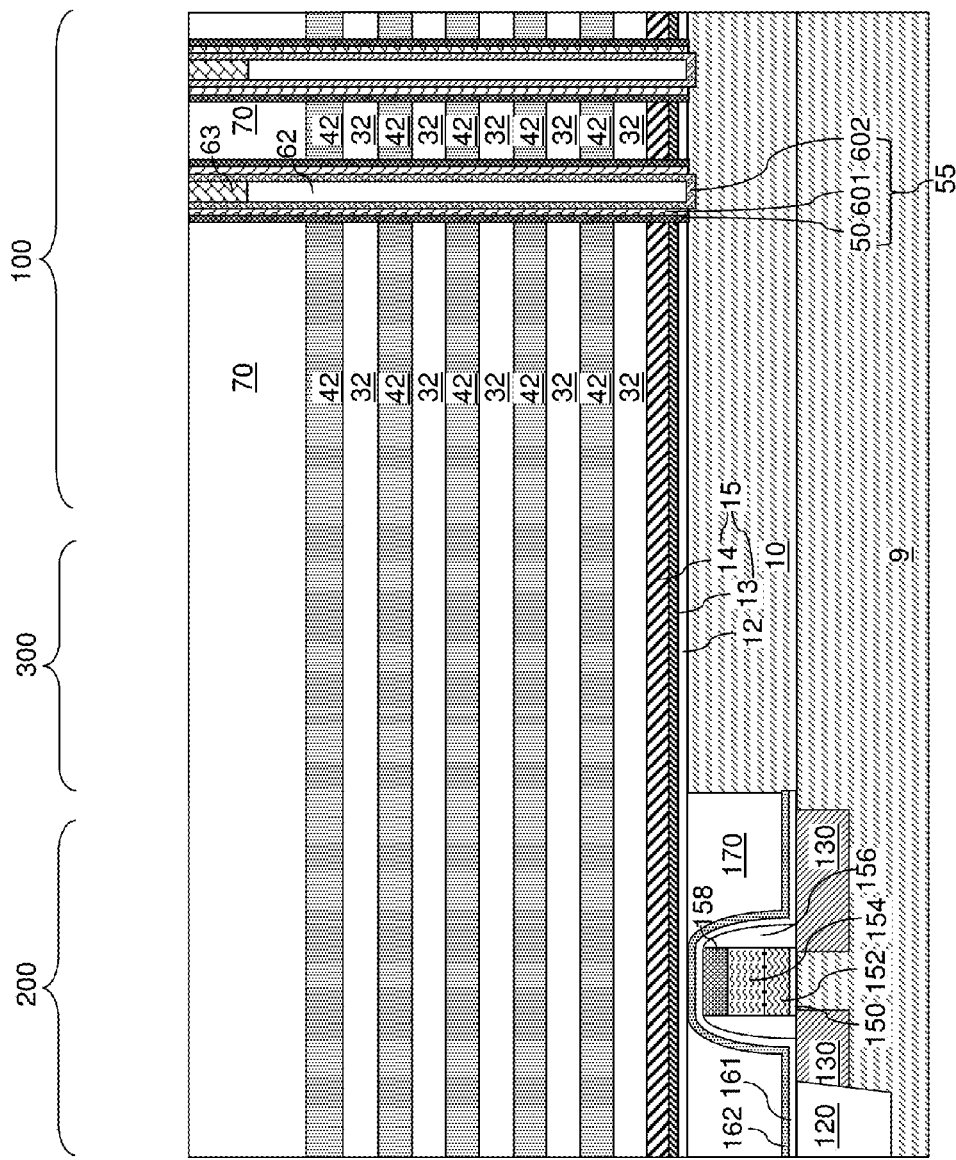
FIG. 5 is a vertical cross-sectional view of the exemplary structure after formation of memory stack structures according to an embodiment of the present disclosure.

Multiple instances of the exemplary memory stack structure of FIG. 4F, or a derivative thereof, can be embedded into the exemplary structure illustrated in FIG. 3. FIG. 5 illustrates the exemplary structure that incorporates multiple instances of the exemplary memory stack structure of FIG. 4F. The exemplary structure includes a semiconductor device, which comprises a stack (32, 42) including an alternating plurality of material layers (e.g., the spacer material layers 42) and insulator layers 32 located over a semiconductor substrate (9, 10), and a memory opening extending through the stack (32, 42). The semiconductor device further comprises at least one blocking dielectric layer 502 vertically extending from a horizontal plane including the interface between the semiconductor substrate (9, 10) and the dielectric liner 12 to the insulating cap layer 70. While the present disclosure is described employing the illustrated configuration for the memory stack structure, the methods of the present disclosure can be applied to alternative memory stack structures including a polycrystalline semiconductor channel.

Figure 6:
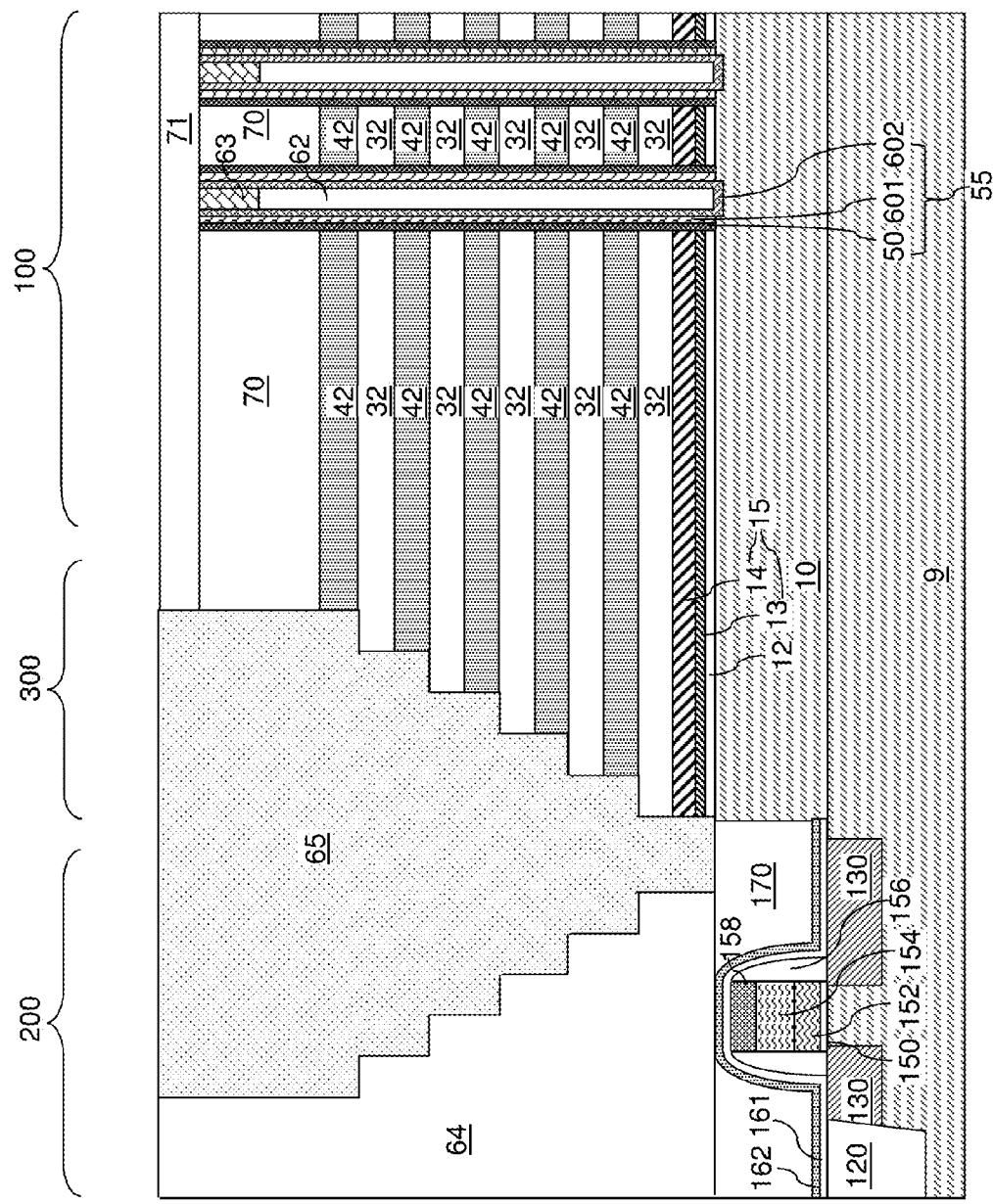
FIG. 6 is a vertical cross-sectional view of the exemplary structure after formation of a stepped terrace and a retro-stepped dielectric material portion according to an embodiment of the present disclosure.

Referring to FIG. 6, at least one dielectric cap layer 71 can be optionally formed over the planarization dielectric layer 70. The at least one dielectric cap layer 71 can include a dielectric material that can be employed as a stopping layer in a subsequent planarization process. In one embodiment, the at least one dielectric cap layer 71 can include a dielectric metal oxide, silicon nitride, a nitrogen-containing organosilicate glass, silicon oxynitride, and/or silicon oxide. The thickness of the at least one dielectric cap layer 71 can be in a range from 10 nm to 300 nm, although lesser and greater thicknesses can also be employed.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes the peripheral device region 200 and a portion of a contact region 300, which is adjacent to the device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 7A:
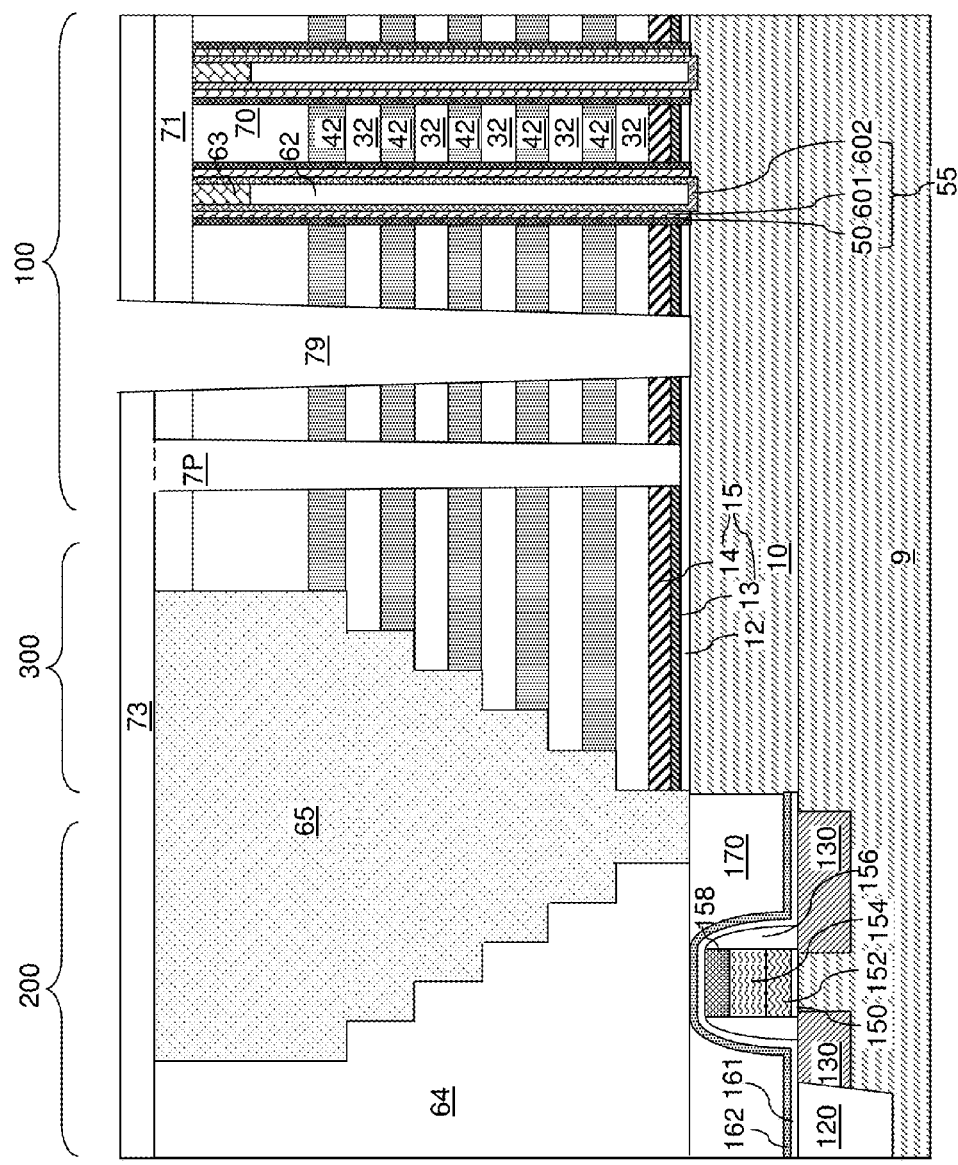
FIG. 7A is a vertical cross-sectional view of the exemplary structure after formation of a backside via cavity and backside recesses according to an embodiment of the present disclosure.
Figure 7B:
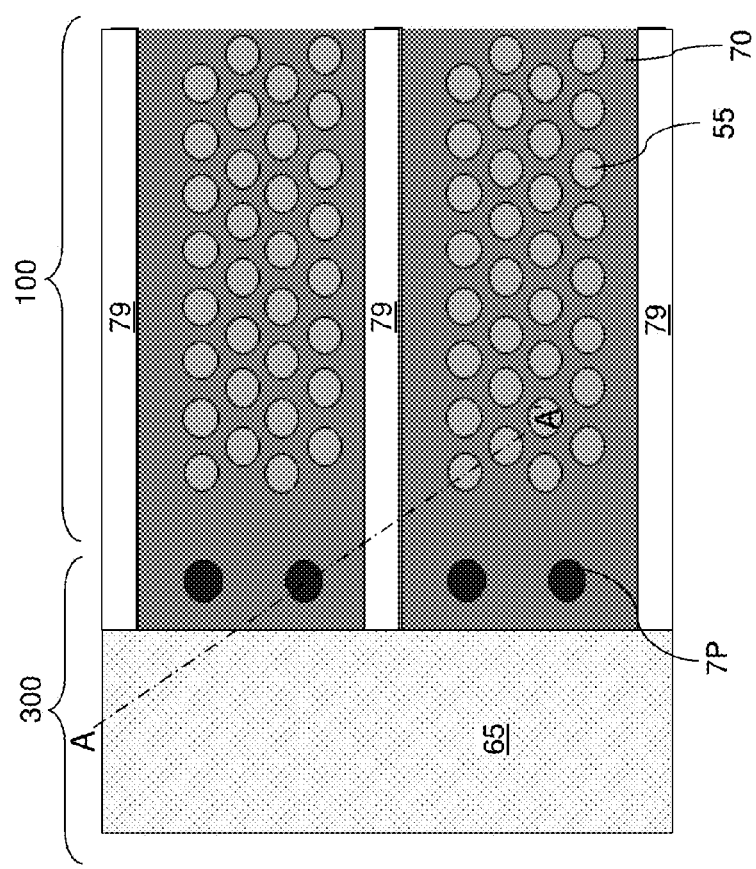
FIG. 7B is a see-through top-down view of the exemplary structure of FIG. 7A. The vertical plane A-A' is the plane of the vertical cross-sectional view of FIG. 7A.

Referring to FIGS. 7A and 7B, at least one dielectric support pillar 7P may be optionally formed through the retro-stepped dielectric material portion 65 and/or through the alternating stack (32, 42). The plane A-A' in FIG. 7B corresponds to the plane of the vertical cross-sectional view of FIG. 7A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the spacer material layers 42.

In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

In one embodiment, the at least one backside contact trench 79 can be formed through the alternating stack (32, 42) by an anisotropic etch process that employs the bottom conductive layer 15 as an etch stop layer. In other words, the etch chemistry can be selected such that the bottom conductive layer 15 functions as an etch stop layer. In one embodiment, the etch chemistry can employ a hydrofluorocarbon based etchant gas or a hydrochlorocarbon based etchant gas.

Subsequently, the at least one backside contact trench 79 can be vertically extended downward by etching each physically exposed portion of the bottom conductive layer 15, and then by etching each physically exposed portion of the dielectric liner 12. The physically exposed portions of the bottom conductive layer 15 underlying the memory openings are herein referred to as second physically exposed portions of the bottom conductive layer 15, and the physically exposed portions of the dielectric liner 12 are herein referred to as second physically exposed portions of the dielectric liner 12. The second physically exposed portions of the dielectric liner 12 can be etched employing an etch chemistry that is selective a semiconductor material of the semiconductor substrate (9, 10), e.g., the semiconductor material of the semiconductor material layer 10. For example, if the dielectric liner 12 includes silicon oxide, an etch chemistry employing hydrofluoric acid, either in vapor phase or in liquid phase, can be employed to etch the first physically exposed portion of the dielectric liner 12. Overetch into the semiconductor substrate (9, 10) can be eliminated or can be insignificant, and the bottom surfaces of the at least one backside contact trench 79 can be coplanar with the interface between the semiconductor substrate (9, 10) and the dielectric liner 12.

Figure 8:
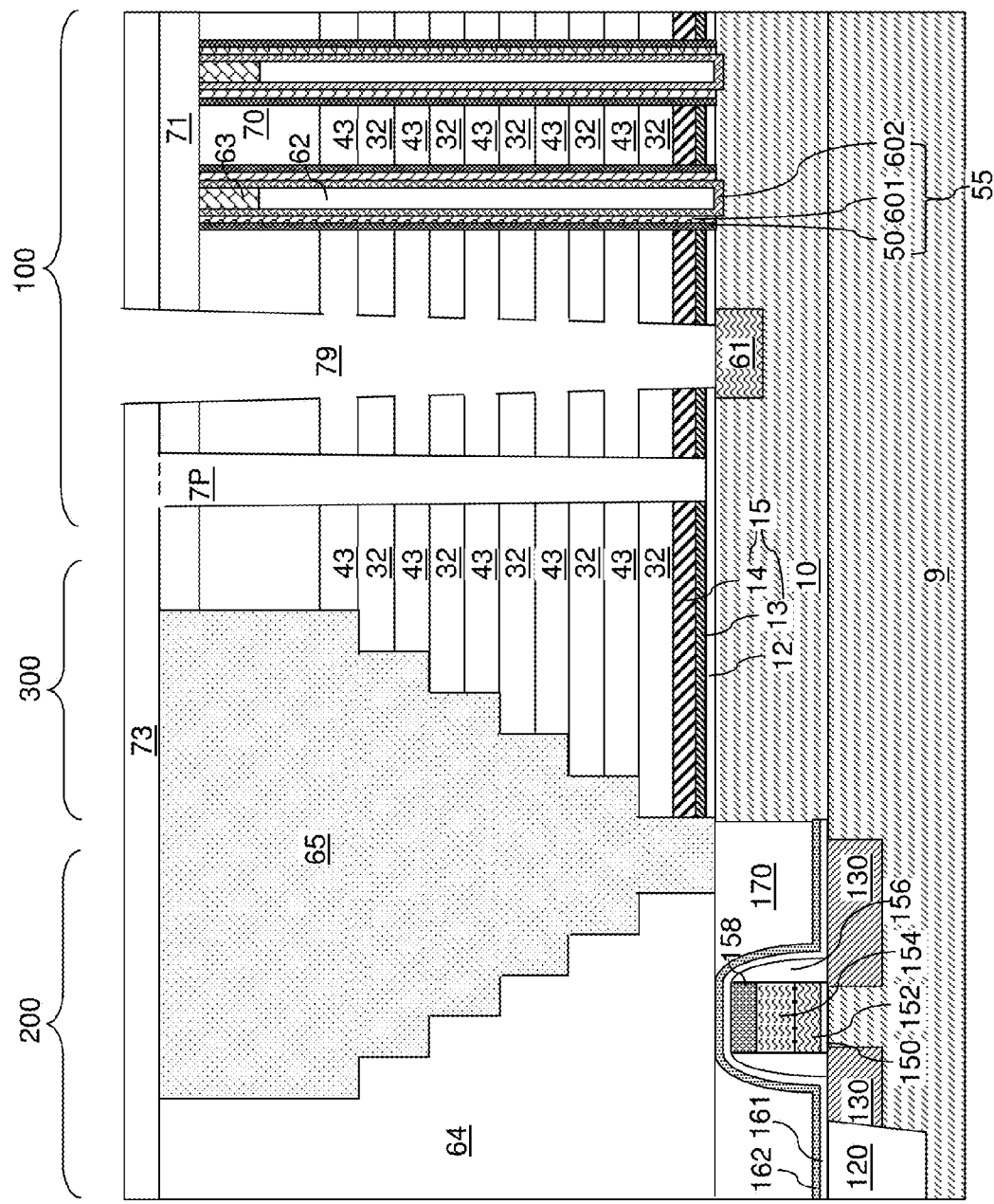
FIG. 8 is a vertical cross-sectional view of the exemplary structure after formation of backside recesses according to an embodiment of the present disclosure.

Referring to FIG. 8, a source region 61 can be formed in each surface portion of the semiconductor material layer 10 that underlies the at least one backside contact trench 79. Each source region 61 can be formed by implanting electrical dopants of the same conductivity type as the doping type of the drain regions 63. In one embodiment, each source region 61 can be formed by ion implantation and/or plasma doping. In one embodiment, at least the portion of the semiconductor material layer 10 underlying the memory stack structures 55 and the at least one backside contact trench 79 can have a doping of a first conductivity type (which can be p-type or n-type), and the at least one source region 61 and the drain regions 63 can have a doping of a second conductivity type that is the opposite of the first conductivity type. The vertical semiconductor channels 60 can have a doping of the first conductivity type, or can be intrinsic.

In one embodiment, the spacer material layers 42 can be sacrificial material layers that can be removed selective to the first material of the insulator layers 32. For example, the spacer material layers 42 can comprise silicon nitride that can be removed selective to the insulator layers 32 (which can comprise silicon oxide). An etchant that selectively etches the second material of the spacer material layers 42 with respect to the first material of the insulator layers 32 can be introduced into the at least one backside contact trench 79, for example, employing an etch process. Backside recesses 43 are formed in volumes from which the spacer material layers 42 are removed. The removal of the second material of the spacer material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the spacer material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the spacer material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric liner 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the spacer material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the spacer material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the spacer material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout.

Optionally, a backside blocking dielectric layer (not shown) can be formed on the physically exposed surface portions of the memory film 50 and surfaces of the insulator layers 32, the insulating cap layer 70, the dielectric cap layer 71, and the optional dielectric pillar material layer 73. As used herein, a "backside" blocking dielectric layer refers to a blocking dielectric layer located outside, or at a peripheral portion of, a memory opening. The backside blocking dielectric layer can comprise a material that is different from, or the same as, the material of the at least one blocking dielectric layer 502 (See FIG. 4B). For example, the backside blocking dielectric layer can comprise a dielectric metal oxide (such as aluminum oxide), and the at least one blocking dielectric layer 502 can comprise silicon oxide. The optional backside blocking dielectric layer can function, in conjunction with the at least one blocking dielectric layer 502, as an additional dielectric material layer that blocks leakage of stored electrical charges to control gate electrodes. In one embodiment, the backside blocking dielectric layer includes aluminum oxide. Alternatively, the at least one blocking dielectric layer 502 may be omitted, and a backside blocking dielectric layer may be the only dielectric material between charge storage elements and control gate electrodes.

Figure 9:
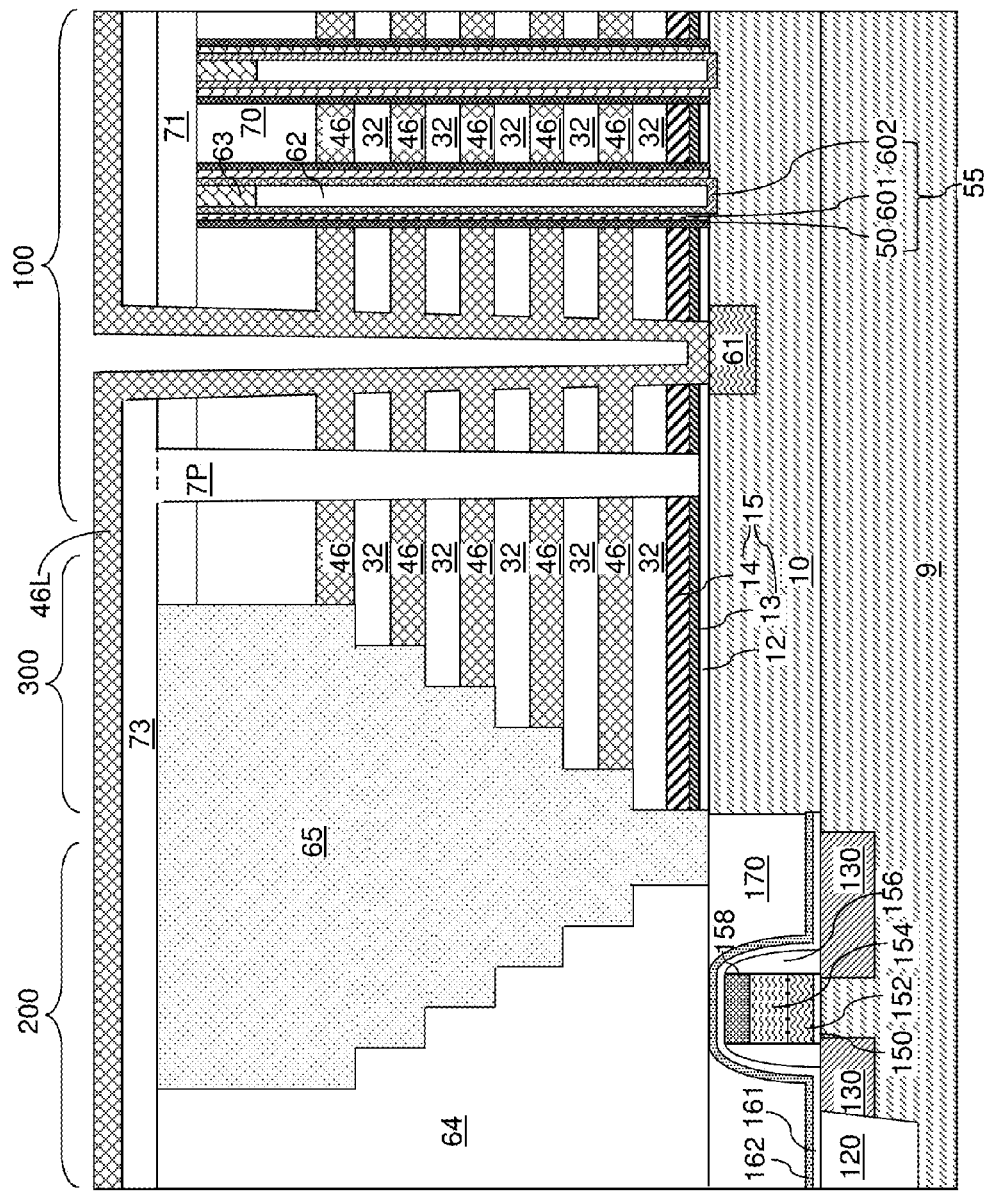
FIG. 9 is a vertical cross-sectional view of the exemplary structure after formation of the electrically conductive lines according to an embodiment of the present disclosure.
Figure 10:
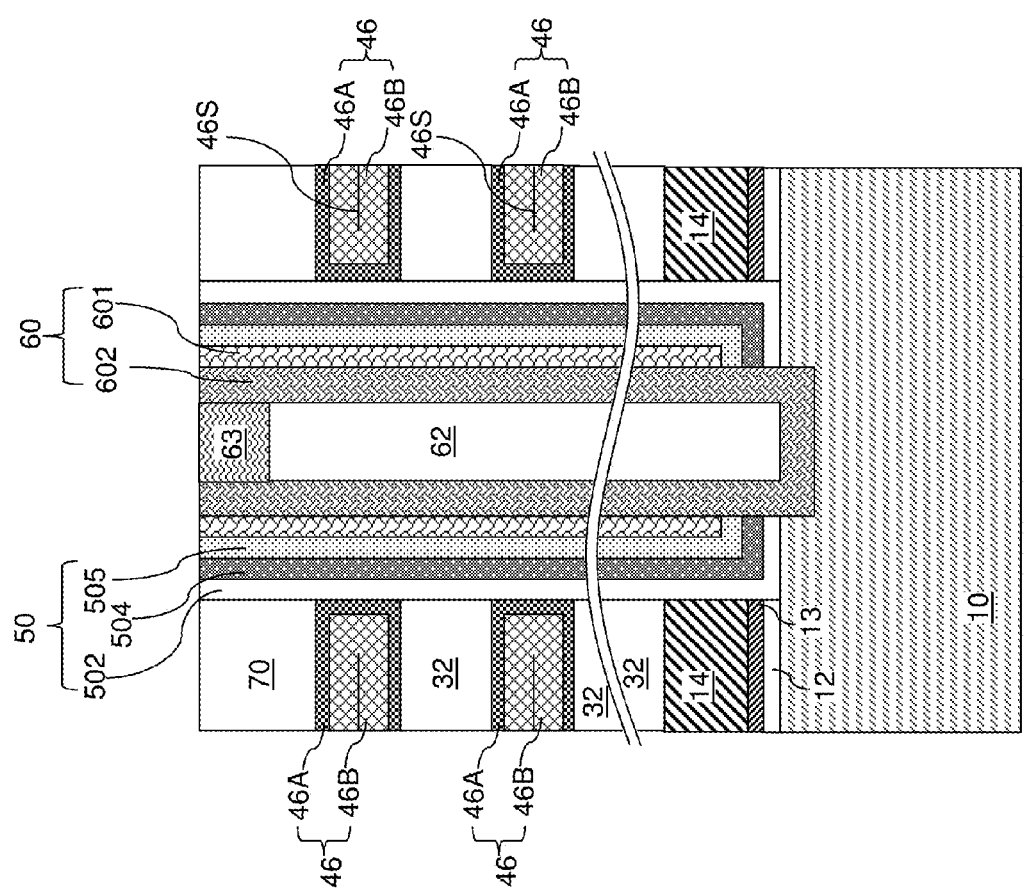
FIG. 10 is a magnified view of a portion of the exemplary structure of FIG. 9.

Referring to FIGS. 9 and 10, at least one conductive material can be deposited in the plurality of backside recesses 43, on sidewalls of the at least one backside contact trench 79, and over the top surface of the dielectric pillar material layer 73 (or the topmost layer of the exemplary structure in case the dielectric pillar material layer 73 is not employed). As used herein, a conductive material refers to an electrically conductive material. Each conductive material can be deposited by a conformal deposition method, which can be, for example, chemical vapor deposition (CVD), atomic layer deposition (ALD), electroless plating, electroplating, or a combination thereof. Each conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. The at least one conductive material is deposited directly on horizontal surfaces of the insulator layers 32 and on the outer sidewalls of the at least one blocking dielectric layer 502.

In one embodiment, the at least one conductive material can comprise a metal such as tungsten and/or metal nitride.

In one embodiment, the at least one conductive material for filling the plurality of backside recesses 43 can be selected from tungsten and a combination of titanium nitride and tungsten. In one embodiment, the at least one conductive material can be deposited by chemical vapor deposition. In one embodiment, the at least one conductive can include a first conductive material comprising a conductive metallic compound (which is herein referred to as a second conductive metallic compound in contrast with the first conductive metallic compound of the bottom metallic liner 13) and a metallic material (which is herein referred to as a second metallic material in contrast with the first metallic material of the bottom metallic material layer 14) comprising an elemental metal or an alloy of at least two elemental metals. The second metallic material can be selected from an elemental metal and an alloy of at least two elemental metals.

In this case, the deposited conductive material layers can include a metallic liner 46A comprising the second conductive metallic compound and a metallic fill material layer 46B comprising the second metallic material. In one embodiment, the metallic liner 46A can include a conductive metallic nitride such as TiN, TaN, WN, or a combination or an alloy thereof, and/or a conductive metallic carbide such as TiC, TaC, WC, or a combination or an alloy thereof. The metallic fill material layer 46B can comprise an elemental metal such as W, Cu, Al, Ta, Co, Ni, Pt, Mo, and Ru, or a stack thereof, or an alloy thereof. In one embodiment, the metallic liner 46A can include titanium nitride, and the metallic fill material layer 46B can comprise tungsten.

A combination of a portion of the metallic liner 46A and a portion of the metallic fill material layer 46B that fills each backside recess 43 constitutes an electrically conductive layer 46. A plurality of electrically conductive layers 46 can be formed in the plurality of backside recesses 43, and a contiguous conductive material layer 46L can be formed on the sidewalls of each backside contact trench 79 and over the dielectric pillar material layer 73 (or the topmost layer of the exemplary structure in case the dielectric pillar material layer 73 is not employed). Thus, at least a portion of each spacer material layer 42 can be replaced with an electrically conductive layer 46, which is a conductive material portion.

In one embodiment, the first conductive metallic compound of the bottom metallic liner 13 comprises a first metallic nitride, and the second conductive metallic compound of the metallic liner 46A comprises a second metallic nitride. The first conductive metallic compound of the bottom metallic liner 13 and the second conductive metallic compound of the metallic liner 46A can differ from each other by at least one of thickness and composition.

In one embodiment, each of the electrically conductive layers 46 can have a seam 46S which extends horizontally and at which two portions of a respective electrically conductive layer 46 are adjoined. Specifically, the metallic fill material layer 46B within each electrically conductive layer 46 can have an upper portion and a lower portion that are adjoined to each other at a seam 46S. In contrast, each of the bottom metallic liner 13 and the bottom metallic material layer 14 can be free of any seam therein.

Figure 11:
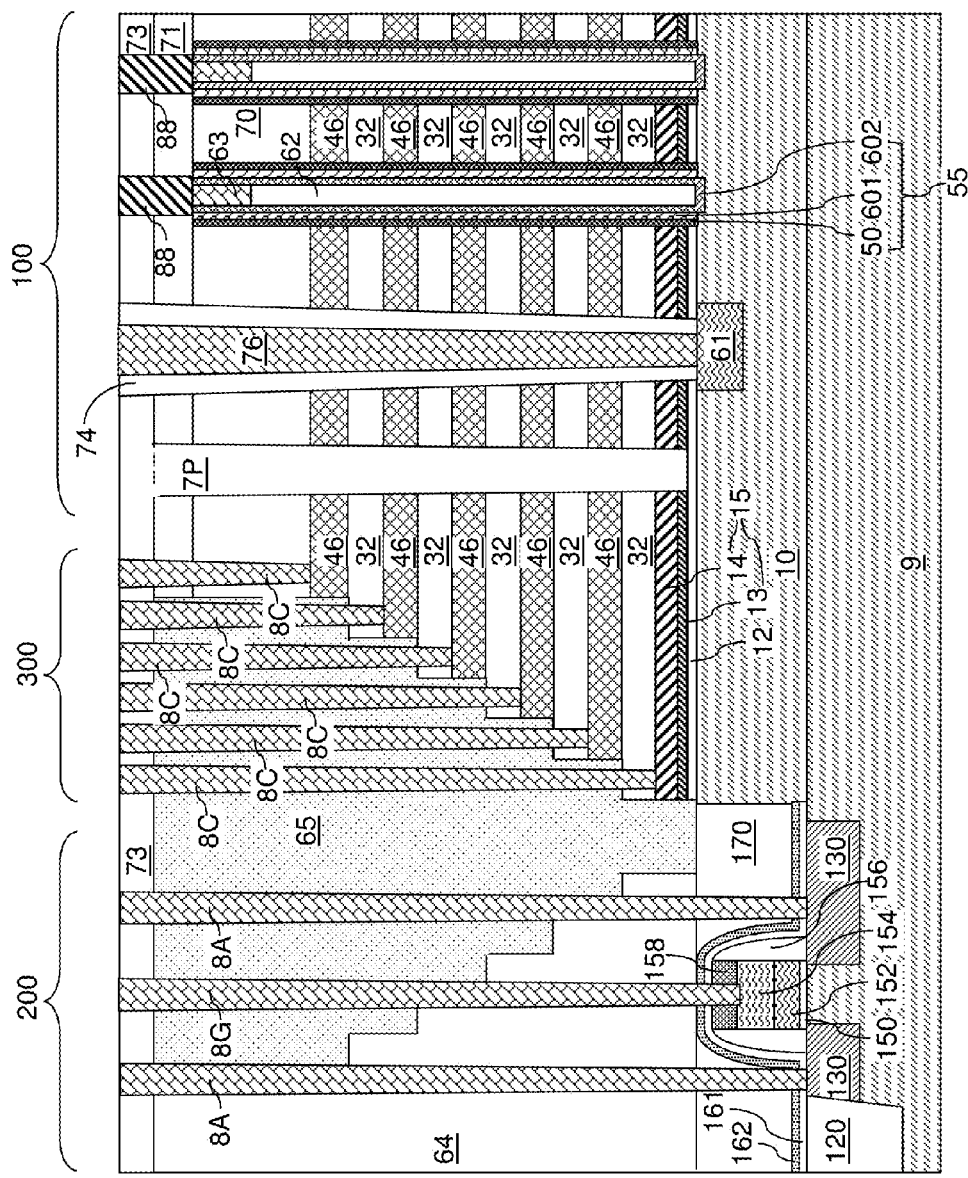
FIG. 11 is a vertical cross-sectional view of the exemplary structure after formation of a backside insulator spacer and a backside contact via structure according to an embodiment of the present disclosure.

Referring to FIG. 11, the deposited conductive material of the contiguous conductive material layer 46L is etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. Each insulating spacer 74 can be formed on a sidewall of the backside contact trench 79 and on a periphery of a top surface of the semiconductor substrate (9, 10) underneath the backside contact trench 79. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

The same photoresist layer, or another photoresist layer (not shown) applied over the exemplary structure, can be lithographically patterned to form openings within the contact region 300 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, the same photoresist layer, or another photoresist layer (not shown) applied over the exemplary structure, can be lithographically patterned to form openings that overlie the array of drain regions 63 in the device region 100. Drain contact via cavities can be formed through the dielectric pillar material layer 73 and the at least one dielectric cap layer 71.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. Each backside contact via structure 76 can be formed on an inner sidewall of an insulating spacer 74. A gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures 8C can be formed within each contact via cavity that extends to a top surface of the electrically conductive layers 46 in the contact region 300.

The exemplary structure comprises a monolithic three-dimensional memory device, which comprises a dielectric liner 12 contacting a top surface of a semiconductor substrate (9, 10); a bottom conductive layer 15 contacting a top surface of the dielectric liner 12; a stack of alternating layers comprising insulator layers 32 and electrically conductive layers 46 and located over the bottom conductive layer 15; a memory opening 49 extending through the stack (32, 46), the bottom conductive layer 15, and the dielectric liner 12; and a memory film 50 located within the memory opening. A bottommost surface of the memory film 50 can be coplanar with a bottom surface of the dielectric liner 12.

In one embodiment, the bottom conductive layer 15 comprises a bottom metallic liner 13 comprising a first conductive metallic compound and contacting a top surface of the dielectric liner 12, and a bottom metallic material layer 14 comprising a first metallic material selected from an elemental metal and an alloy of at least two elemental metals and contacting the bottom metallic liner 13. In one embodiment, a top surface of the bottom metallic material layer 14 contacts a bottom surface of a bottommost layer among the insulator layers 32 of the stack (32, 46). In one embodiment, the bottom metallic material layer is in physical contact with a sidewall of the memory film 50. In an illustrative example, the dielectric liner 12 can comprise a silicon oxide layer, and the bottom conductive layer 15 can comprise a tungsten layer.

In one embodiment, each of the electrically conductive layers 46 can comprise a metallic liner 46A (See FIG. 10) comprising a second conductive metallic compound and contacting at least one horizontal surface of the insulator layers 32, and a metallic fill material layer 46B comprising a second metallic material selected from an elemental metal and an alloy of at least two elemental metals, contacting the metallic liner 46A, and spaced from the insulator layers 32 at least by the metallic liner 46A. In one embodiment, the metallic fill material layer 46B does not contact the memory film 50, and is laterally spaced from the memory film 50 by the metallic liner 46A.

In one embodiment, the bottom metallic liner 13 and the metallic liners 46A differ in at least one of thickness and composition. In one embodiment, the bottom metallic material layer 14 and the metallic fill material layers 46B can have the same composition. In another embodiment, the bottom metallic material layer 14 and the metallic fill material layers 46B can differ in composition. In one embodiment, the first conductive metallic compound of the bottom metallic liner 13 can comprise a first metallic nitride, and the second conductive metallic compound of the metallic liners 46A can comprise a second metallic nitride. In one embodiment, the interface between the bottommost surface of the memory film 50 and the semiconductor substrate (9, 10) can be coplanar with the interface between the bottom surface of the dielectric liner 12 and the semiconductor substrate (9, 10).

The monolithic three-dimensional memory device can further comprise a semiconductor channel 60 laterally surrounded by the memory film 50 and extending into the semiconductor substrate (9, 10). The monolithic three-dimensional memory device can further comprise a backside contact via structure 76 extending through the stack (32, 46), the bottom conductive layer 15, and the dielectric liner 12. The bottom conductive layer 15 can laterally surround the backside contact via structure 76. In one embodiment, the bottommost surface of the backside contact via structure 76 can be coplanar with the bottom surface of the dielectric liner 12. In one embodiment, a sidewall of the bottom metallic liner 13 and a sidewall of the bottom metallic material layer 14 can be in physical contact with a sidewall of an insulating spacer 74. The insulating spacer 74 contacts a sidewall of the backside contact via structure 76, a sidewall of the bottom conductive layer 15, and a top surface of a source region 61, which includes the same semiconductor material as the semiconductor material of the semiconductor material layer 10.

In one embodiment, each of the electrically conductive layers 46 can have a seam 46S (See FIG. 10) which extends horizontally and at which two portions of a respective electrically conductive layer 46 are adjoined. Each of the bottom metallic liner 13 and the bottom metallic material layer 14 can be free of any seam therein.

In one embodiment, the monolithic three-dimensional memory device can be a vertical NAND memory device, and the electrically conductive layers 46 can comprise, or can be electrically connected to, a respective word line of the vertical NAND memory device. In one embodiment, the bottom conductive layer 15 can be a source select gate electrode of the vertical NAND memory device. In one embodiment, a first subset of the electrically conductive layers 46 located at bottommost levels within the alternating stack (32, 46) can comprise one or more source select gate electrodes of the vertical NAND memory device. In one embodiment, a second subset of the electrically conductive layers 46 located at topmost levels of the alternating stack (32, 46) can comprise one or more drain select gate electrodes of the vertical NAND memory device. In one embodiment, the bottom conductive layer 15 can be a control gate electrode for memory cells or a select gate electrode for select transistors.

In one embodiment, the semiconductor substrate (9, 10) can comprise a silicon substrate, and the vertical NAND memory device can comprise an array of monolithic three-dimensional NAND strings over the silicon substrate. At least one memory cell in the first device level of the three-dimensional array of NAND strings can be located over another memory cell in the second device level of the three-dimensional array of NAND strings. The silicon substrate can contain an integrated circuit comprising a driver circuit for the memory device located thereon.

In one embodiment, the array can comprise: a plurality of semiconductor channels, which comprise the combination of a surface portion of the semiconductor material layer 10 between the source region 61 and the vertical semiconductor channels 60. At least one end portion of each of the plurality of semiconductor channels, i.e., the vertical semiconductor channels 60, extends substantially perpendicular to a top surface of the semiconductor substrate (9, 10). A plurality of charge storage elements is provided within each memory film 50. Each charge storage element can be located adjacent to a respective one of the plurality of semiconductor channels. A plurality of control gate electrodes, as embodied as electrically conductive layers 46, is provided. Each control gate electrode can have a strip shape extending substantially parallel to the top surface of the semiconductor substrate (9, 10). In one embodiment, the plurality of control gate electrodes comprises at least a first control gate electrode located in the first device level and a second control gate electrode located in the second device level.

The devices of the present disclosure may provide the benefits of reduced, or eliminated, collateral etching into a semiconductor substrate during formation of memory openings. Thus, the recess of the semiconductor channels (601, 602) into the substrate semiconductor layer 10 can be minimized or eliminated. Further, collateral damage on the dielectric liner 12, which is a gate dielectric for the bottom conductor layer 15 (which functions as a select gate electrode), is minimized or eliminated.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
   a dielectric liner contacting a top surface of a semiconductor substrate;
   a bottom conductive layer contacting a top surface of the dielectric liner;
   a stack of alternating layers comprising insulator layers and electrically conductive layers and located over the bottom conductive layer;
   a memory opening extending through the stack, the bottom conductive layer, and the dielectric liner; and
   a memory film located within the memory opening, wherein a bottommost surface of the memory film is coplanar with a bottom surface of the dielectric liner,
   wherein the bottom conductive layer comprises:
      a bottom metallic liner comprising a first conductive metallic compound and contacting a top surface of the dielectric liner, and
      a bottom metallic material layer comprising a first metallic material selected from an elemental metal and an alloy of at least two elemental metals and contacting the bottom metallic liner; and
   wherein a horizontal interface between the bottom metallic liner and the bottom metallic material layer is adjoined to an outer sidewall of the memory film.

2. The monolithic three-dimensional memory device of claim 1, wherein a top surface of the bottom metallic material layer contacts a bottom surface of a bottommost layer among the insulator layers of the stack.

3. The monolithic three-dimensional memory device of claim 1, wherein the bottom metallic material layer is in physical contact with a sidewall of the memory film.

4. The monolithic three-dimensional memory device of claim 1, wherein each of the electrically conductive layers comprise:
   a metallic liner comprising a second conductive metallic compound and contacting at least one horizontal surface of the insulator layers; and
   a metallic fill material layer comprising a second metallic material selected from an elemental metal and an alloy of at least two elemental metals, contacting the metallic liner, and spaced from the insulator layers at least by the metallic liner.

5. The monolithic three-dimensional memory device of claim 4, wherein the metallic fill material layer does not contact the memory film, and is laterally spaced from the memory film by the metallic liner.

6. The monolithic three-dimensional memory device of claim 4, wherein the bottom metallic liner and the metallic liners differ in at least one of thickness and composition.

7. The monolithic three-dimensional memory device of claim 4, wherein the bottom metallic material layer and the metallic fill material layers differ in composition.

8. The monolithic three-dimensional memory device of claim 4, wherein:
   the first conductive metallic compound comprises a first metallic nitride; and
   the second conductive metallic compound comprises a second metallic nitride.

9. The monolithic three-dimensional memory device of claim 1, wherein an interface between the bottommost surface of the memory film and the semiconductor substrate is coplanar with an interface between the bottom surface of the dielectric liner and the semiconductor substrate.

10. The monolithic three-dimensional memory device of claim 1, further comprising a semiconductor channel laterally surrounded by the memory film and extending into the semiconductor substrate.

11. The monolithic three-dimensional memory device of claim 1, further comprising a backside contact via structure extending through the stack, the bottom conductive layer, and the dielectric liner, wherein the bottom conductive layer laterally surrounds the backside contact via structure.

12. The monolithic three-dimensional memory device of claim 11, further comprising an insulating spacer contacting a sidewall of the backside contact via structure, a sidewall of the bottom conductive layer, and a top surface of the semiconductor substrate.

13. The monolithic three-dimensional memory device of claim 1, wherein:
   the dielectric liner comprises a silicon oxide layer; and
   the bottom conductive layer comprises a tungsten layer.

14. The monolithic three-dimensional memory device of claim 1, wherein:
   each of the electrically conductive layers has a seam which extends horizontally and at which two portions of a respective electrically conductive layer are adjoined; and the bottom metallic material layer is free of any seam therein.

15. The monolithic three-dimensional memory device of claim 1, wherein:
the monolithic three-dimensional memory device is a vertical NAND memory device; and
the electrically conductive layers comprise, or are electrically connected to, a respective word line of the vertical NAND memory device.

16. The monolithic three-dimensional memory device of claim 15, wherein:
the bottom conductive layer is a source select gate electrode of a source select transistor of the vertical NAND memory device;
the dielectric liner comprises a gate dielectric of the source select transistor; and
a portion of the semiconductor substrate located below the dielectric liner comprises at least a portion of the channel of the source select transistor.

17. The monolithic three-dimensional memory device of claim 15, wherein:
the semiconductor substrate comprises a silicon substrate;
the vertical NAND memory device comprises an array of monolithic three-dimensional NAND strings over the silicon substrate;
at least one memory cell in the first device level of the three-dimensional array of NAND strings is located over another memory cell in the second device level of the three-dimensional array of NAND strings;
the silicon substrate contains an integrated circuit comprising a driver circuit for the memory device located thereon; and
the three-dimensional array of NAND strings comprises:
a plurality of semiconductor channels, wherein at least one end portion of each of the plurality of semiconductor channels extends substantially perpendicular to a top surface of the semiconductor substrate;
a plurality of charge storage elements, each charge storage element located adjacent to a respective one of the plurality of semiconductor channels; and
a plurality of control gate electrodes having a strip shape extending substantially parallel to the top surface of the silicon substrate, the plurality of control gate electrodes comprise at least a first control gate electrode located in the first device level and a second control gate electrode located in the second device level.

18. The monolithic three-dimensional memory device of claim 1, wherein both the bottom metallic material layer and the bottom metallic liner physically contact a portion of the outer sidewall of the memory film.

19. A monolithic three-dimensional memory device, comprising:
a dielectric liner contacting a top surface of a semiconductor substrate;
a bottom conductive layer contacting a top surface of the dielectric liner;
a stack of alternating layers comprising insulator layers and electrically conductive layers and located over the bottom conductive layer;
a memory opening extending through the stack, the bottom conductive layer, and the dielectric liner; and
a memory film located within the memory opening, wherein a bottommost surface of the memory film is coplanar with a bottom surface of the dielectric liner, wherein the bottom conductive layer comprises:
a bottom metallic liner comprising a first conductive metallic compound and contacting a top surface of the dielectric liner, and
a bottom metallic material layer comprising a first metallic material selected from an elemental metal and an alloy of at least two elemental metals and contacting the bottom metallic liner; and
wherein both the bottom metallic material layer and the bottom metallic liner physically contact a portion of an outer sidewall of the memory film.

20. The monolithic three-dimensional memory device of claim 19, wherein a top surface of the bottom metallic material layer contacts a bottom surface of a bottommost layer among the insulator layers of the stack.

21. The monolithic three-dimensional memory device of claim 19, wherein the bottom metallic material layer is in physical contact with a sidewall of the memory film.

22. The monolithic three-dimensional memory device of claim 19, wherein each of the electrically conductive layers comprise:
a metallic liner comprising a second conductive metallic compound and contacting at least one horizontal surface of the insulator layers; and
a metallic fill material layer comprising a second metallic material selected from an elemental metal and an alloy of at least two elemental metals, contacting the metallic liner, and spaced from the insulator layers at least by the metallic liner.

23. The monolithic three-dimensional memory device of claim 22, wherein the metallic fill material layer does not contact the memory film, and is laterally spaced from the memory film by the metallic liner.

24. The monolithic three-dimensional memory device of claim 22, wherein the bottom metallic liner and the metallic liners differ in at least one of thickness and composition.

25. The monolithic three-dimensional memory device of claim 22, wherein the bottom metallic material layer and the metallic fill material layers differ in composition.

26. The monolithic three-dimensional memory device of claim 22, wherein:
the first conductive metallic compound comprises a first metallic nitride; and
the second conductive metallic compound comprises a second metallic nitride.

27. The monolithic three-dimensional memory device of claim 19, wherein an interface between the bottommost surface of the memory film and the semiconductor substrate is coplanar with an interface between the bottom surface of the dielectric liner and the semiconductor substrate.

28. The monolithic three-dimensional memory device of claim 19, further comprising a semiconductor channel laterally surrounded by the memory film and extending into the semiconductor substrate.

29. The monolithic three-dimensional memory device of claim 19, further comprising:
a backside contact via structure extending through the stack, the bottom conductive layer, and the dielectric liner, wherein the bottom conductive layer laterally surrounds the backside contact via structure; and
an insulating spacer contacting a sidewall of the backside contact via structure, a sidewall of the bottom conductive layer, and a top surface of the semiconductor substrate.

30. The monolithic three-dimensional memory device of claim 19, wherein:
the dielectric liner comprises a silicon oxide layer;
the bottom conductive layer comprises a tungsten layer;

each of the electrically conductive layers has a seam which extends horizontally and at which two portions of a respective electrically conductive layer are adjoined; and the bottom metallic material layer is free of any seam therein.

31. The monolithic three-dimensional memory device of claim 19, wherein:

the monolithic three-dimensional memory device is a vertical NAND memory device; and the electrically conductive layers comprise, or are electrically connected to, a respective word line of the vertical NAND memory device.

32. The monolithic three-dimensional memory device of claim 31, wherein:

the bottom conductive layer is a source select gate electrode of a source select transistor of the vertical NAND memory device;

the dielectric liner comprises a gate dielectric of the source select transistor;

a portion of the semiconductor substrate located below the dielectric liner comprises at least a portion of the channel of the source select transistor;

the semiconductor substrate comprises a silicon substrate;

the vertical NAND memory device comprises an array of monolithic three-dimensional NAND strings over the silicon substrate;

at least one memory cell in the first device level of the three-dimensional array of NAND strings is located over another memory cell in the second device level of the three-dimensional array of NAND strings;

the silicon substrate contains an integrated circuit comprising a driver circuit for the memory device located thereon; and the three-dimensional array of NAND strings comprises:

a plurality of semiconductor channels, wherein at least one end portion of each of the plurality of semiconductor channels extends substantially perpendicular to a top surface of the semiconductor substrate;

a plurality of charge storage elements, each charge storage element located adjacent to a respective one of the plurality of semiconductor channels; and a plurality of control gate electrodes having a strip shape extending substantially parallel to the top surface of the silicon substrate, the plurality of control gate electrodes comprise at least a first control gate electrode located in the first device level and a second control gate electrode located in the second device level.

\* \* \* \* \*